United States Patent
Kang et al.

(10) Patent No.: US 9,500,667 B2
(45) Date of Patent: Nov. 22, 2016

(54) POLLING SYSTEM AND POLLING METHOD USING THE SAME

(71) Applicant: SAMSUNG ELECTRO-MECHANICS CO., LTD., Suwon (KR)

(72) Inventors: Yun Sung Kang, Suwon (KR); Jung Won Lee, Suwon (KR); Sang Jin Kim, Suwon (KR); Jeong Suong Yang, Suwon (KR); Seung Mo Lim, Suwon (KR); Kyo Yeol Lee, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 675 days.

(21) Appl. No.: 14/045,585

(22) Filed: Oct. 3, 2013

(65) Prior Publication Data

US 2014/0346892 A1    Nov. 27, 2014

(30) Foreign Application Priority Data

May 23, 2013    (KR) .................. 10-2013-0058511

(51) Int. Cl.
| | |
|---|---|
| *G01P 15/09* | (2006.01) |
| *G01R 31/28* | (2006.01) |
| *G01C 25/00* | (2006.01) |
| *H01L 41/22* | (2013.01) |
| *G01R 11/25* | (2006.01) |
| *G01R 29/22* | (2006.01) |

(52) U.S. Cl.
CPC .............. *G01P 15/09* (2013.01); *G01C 25/00* (2013.01); *G01R 31/2829* (2013.01); *H01L 41/22* (2013.01); *G01R 29/22* (2013.01); *Y10T 307/76* (2015.04)

(58) Field of Classification Search
CPC ....................................................... G01R 11/25
USPC ........................................................ 307/113
See application file for complete search history.

(56) References Cited

U.S. PATENT DOCUMENTS

2012/0125096 A1    5/2012    Park

FOREIGN PATENT DOCUMENTS

JP    07-066260    3/1995

OTHER PUBLICATIONS

Office action dated Aug. 7, 2014 from corresponding Korean Patent Application No. 10-2013-0058511 and its English summary provided by the applicant.

*Primary Examiner* — Robert Deberadinis
(74) *Attorney, Agent, or Firm* — NSIP Law

(57) ABSTRACT

Disclosed herein is a polling system, including: a matrix element including individual elements including upper electrodes and lower electrodes, the individual elements being arrayed in plural, the upper electrodes of the individual elements being each connected in series to form upper electrode units which are arrayed in plural and the lower electrodes of the individual elements being each connected in series to form lower electrode units which are arrayed in plural; an upper switch connected to each of the upper electrode units which is arrayed in plural; a lower switch connected to each of the lower electrode units which is arrayed in plural; and a polling unit performing polling to apply voltage to the upper electrodes and the lower electrodes, respectively.

10 Claims, 4 Drawing Sheets

POLLING SYSTEM AND POLLING METHOD USING THE SAME

CROSS REFERENCE TO RELATED APPLICATION

This application claims the benefit of Korean Patent Application No. 10-2013-0058511, filed on May 23, 2013, entitled "Polling System And Polling Method Using The Same" which is hereby incorporated by reference in its entirety into this application.

BACKGROUND OF THE INVENTION

1. Technical Field

The present invention relates to a polling system and a polling method using the same.

2. Description of the Related Art

Presently, an inertial sensor has been used in various applications, for example, the military such as an artificial satellite, a missile, an unmanned aircraft, and the like, vehicles such as an air bag, electronic stability control (ESC), a black box for a vehicle, and the like, hand shaking prevention of a camcorder, motion sensing of a mobile phone or a game machine, navigation, and the like.

The inertial sensor has generally adopted a configuration in which a mass body is adhered to an elastic substrate such as a membrane, and the like, in order to measure acceleration and angular velocity. Through the above-mentioned configuration, the inertial sensor may calculate the acceleration by measuring an inertial force applied to the mass body and the angular velocity by measuring a Coriolis force applied to the mass body.

In detail, a method of measuring the acceleration and the angular velocity using the inertial sensor will be described below. First, the acceleration may be calculated by Newton's law of motion "F=ma", where "F" represents the inertial force applied to the mass body, "m" represents a mass of the mass body, and "a" is the acceleration to be measured. Among others, the acceleration a may be obtained by detecting the inertial force F applied to the mass body and dividing the sensed inertial force F by the mass m of the mass body that is a predetermined value. Further, the angular velocity may be obtained by the Coriolis force "F=2mΩ×v", where "F" represents the Coriolis force applied to the mass body, "m" represents the mass of the mass body, "Ω" represents the angular velocity to be measured, and "v" represents the motion velocity of the mass body. Among others, since the motion velocity V of the mass body and the mass m of the mass body are values known in advance, the angular velocity Ω may be obtained by detecting the Coriolis force (F) applied to the mass body.

Meanwhile, a piezo-electric element in the inertial sensor according to the prior art including the following prior art document is deformed when applied with voltage, but generates charges when applied with an external force. With above the characteristics, the piezo-electric element may be variously used in various actuators, sensors, and the like. In addition, as the piezo-electric element, there are various materials, such as Aln, ZnO, quartz, and the like, but a PZT having a piezo-electric constant has been mainly used in various fields.

Further, in order to improve the characteristics of the piezo-electric element, the piezo-electric element needs to be subjected to a polling process before most elements are manufactured and then operated. Herein, the polling process is to improve piezoelectric characteristics by applying temperature and voltage.

However, in connection with the polling process, when the plurality of elements is individually subjected to the polling process, productivity may be degraded and when the plurality of elements is subjected to the polling process at one time, accurate and effective polling may not be implemented due to defective elements.

PRIOR ART DOCUMENT

Patent Document (Patent Document 1) US 2012-0125096

SUMMARY OF THE INVENTION

The present invention has been made in an effort to provide a polling system capable of detecting defective elements by measuring electrical characteristics of each element in a matrix element, removing the defective elements by applying overvoltage only to defective elements though an upper switch and a lower switch to burn the defective elements, performing accurate polling by performing the polling on the entire matrix element, and improving a yield of all the elements within a wafer, and a polling method using the same.

According to a preferred embodiment of the present invention, there is provided a polling system, including: a matrix element including individual elements including upper electrodes and lower electrodes, the individual elements being arrayed in plural, the upper electrodes of the individual elements each connected in series to form upper electrode units which are arrayed in plural and the lower electrodes of the individual elements each connected in series to form lower electrode units which are arrayed in plural; an upper switch connected to each of the upper electrode units which is arrayed in plural; a lower switch connected to each of the lower electrode units which is arrayed in plural; and a polling unit performing polling to apply voltage to the upper electrodes and the lower electrodes, respectively.

The upper electrode units connected in series and the lower electrode units connected in series may be connected to be orthogonal to each other.

The polling system may further include: a switch control unit connected to the upper switch and the lower switch and selectively controlling a turn on and off of the upper switch and the lower switch when the polling unit applies voltage.

The polling system may further include: a control unit connected to the polling unit and the switch control unit and controlling the polling and burning.

The polling unit may apply overvoltage only to the individual elements detected as defective elements through the upper switch and the lower switch to burn the individual elements.

The polling unit may apply overvoltage only to the individual elements detected as defective elements through the upper switch and the lower switch to burn the individual elements.

According to another preferred embodiment of the present invention, there is provided a polling method using the polling system as described above, the polling method including: (A) forming a matrix element by connecting and grouping upper electrodes and lower electrodes and arraying the grouped upper electrodes and lower electrodes in plural;

(B) measuring electrical characteristics of individual elements by connecting an upper switch to each of the upper electrodes grouped and arrayed in plural in the matrix element and a lower switch to each of the lower electrodes grouped and arrayed in plural therein; (C) individually applying overvoltage only to detect defective elements to burn the defective elements; and (D) polling the entire matrix element normalized by removing the defective elements.

In the (C), a plurality of upper switches and a plurality of lower switches each connected to the upper electrodes grouped and arrayed in plural and the lower electrodes grouped and arrayed in plural may be selectively operated to apply overvoltage to the defective elements.

In the (B), the electrical characteristics of the individual elements may be resistance, current, a dielectric constant, and a tangent loss.

In the (D), all of the plurality of upper switches and the plurality of lower switches may be turned on and the polling may be performed on the entire matrix element.

BRIEF DESCRIPTION OF THE DRAWINGS

The above and other objects, features and advantages of the present invention will be more clearly understood from the following detailed description taken in conjunction with the accompanying drawings, in which:

FIG. 4 is a diagram schematically illustrating the process of performing a polling process using the polling system illustrated in FIG. 1, in which

DESCRIPTION OF THE PREFERRED EMBODIMENTS

Figure 1:
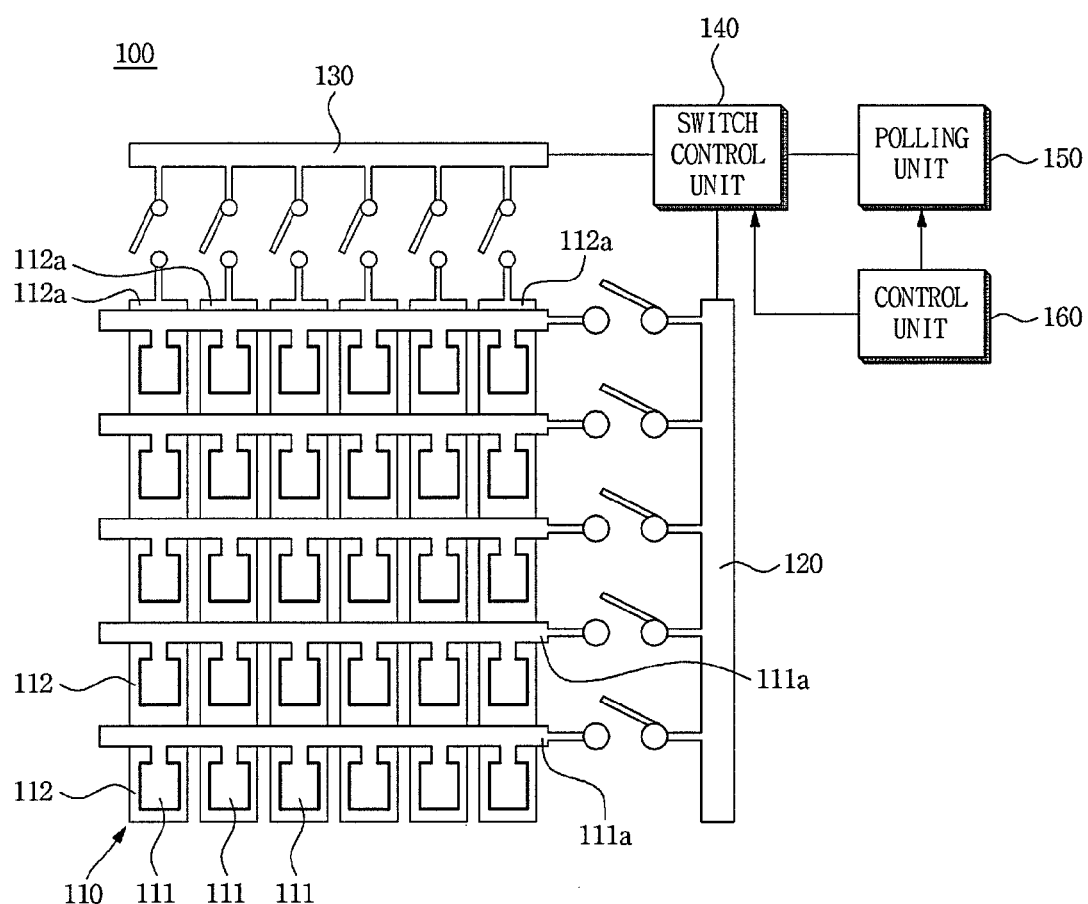
FIG. 1 is a configuration diagram schematically illustrating a polling system according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a configuration diagram schematically illustrating a polling system according to a preferred embodiment of the present invention. As illustrated in FIG. 1, a polling system 100 includes a matrix element 110, an upper switch 120, a lower switch 130, a switch control unit 140, a polling unit 150, and a control unit 160.

In more detail, the matrix element 110 includes a plurality of individual elements which includes upper electrodes 111 and lower electrodes 112. Further, the individual elements are arrayed in plural and the upper electrodes of the individual elements are each connected in series to form upper electrode units 111a which are arrayed in plural.

Further, the lower electrodes of the individual elements are each connected in series to form lower electrode units 112a which are arrayed in plural.

Further, the upper electrode units 111a connected in series and the lower electrode units 112a connected in series may be connected to be orthogonal to each other. Further, the upper electrodes connected in series and grouped and the lower electrodes connected in series and grouped are arrayed in plural to form the matrix element 110.

Further, the upper switches are connected in plural and are each connected to the arrayed upper electrode units 111a.

Further, the lower switches are connected in plural and are each connected to the arrayed lower electrode units 112a.

In addition, the upper switch 120 and the lower switch 130 are each connected to the switch control unit 140 and the switch control unit 140 controls a turn on and off of the upper switch 120 and the lower switch 130 which are each connected to the upper electrode 111 and the lower electrode 112 in the matrix element 110.

Further, the matrix element 110 may measure electrical characteristics of the individual elements, for example, resistance, current, dielectric constant, tangent loss, and the like, by connecting the individual elements to the upper electrodes and the lower electrodes, respectively.

Next, the polling unit 150 applies voltage to the matrix element 110 to perform polling or applies overvoltage to defective elements detected by measuring the electrical characteristics to perform burning.

Further, the control unit 160 is connected to the switch control unit 140 and the polling unit 150 to control the polling and the burning.

By the above-mentioned configuration, the polling system 100 according to the preferred embodiment of the present invention may detect the defect of the individual elements by measuring the electrical characteristics for each individual element in the matrix element 110 and burn the defective elements by applying the overvoltage only to the detected defective elements through the upper switch 120 and the lower switch 130 to normalize a group connected to the defective elements and then perform the polling on the entire matrix element 110.

Figure 2:
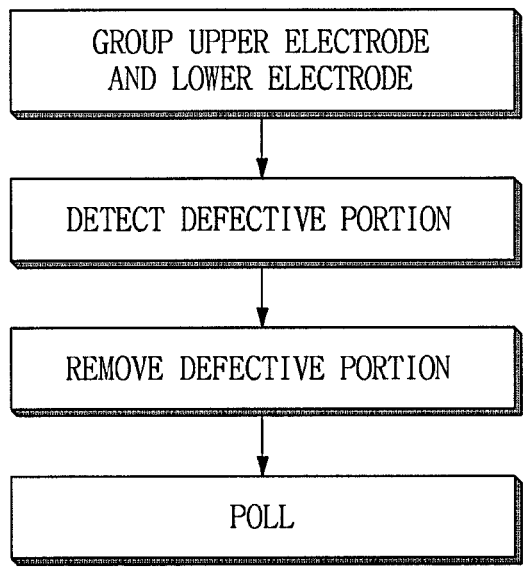
FIG. 2 is a conceptual diagram schematically illustrating a polling method using the polling system illustrated in FIG. 1.

FIG. 2 is a conceptual diagram schematically illustrating a polling method using the polling system illustrated in FIG. 1.

As illustrated in FIG. 2, the polling method using the polling system according to the preferred embodiment of the present invention groups the upper electrode and the lower electrode to form the matrix element and detects the defective portions in the matrix element, removes the detected defective portions, and performs the polling on the entire matrix element.

Figure 3:
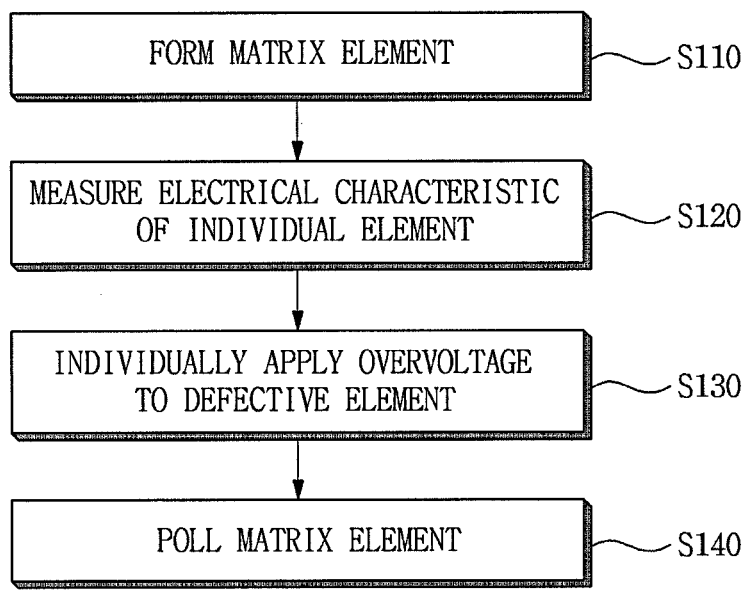
FIG. 3 is a flow chart schematically illustrating the polling method using the polling system according to the preferred embodiment of the present invention.

FIG. 3 is a flow chart schematically illustrating the polling method using the polling system according to the preferred embodiment of the present invention.

As illustrated in FIG. 3, the polling method (S100) includes forming the matrix element (S110), measuring the electrical characteristics of the individual elements (S120), individually applying voltage to the defective elements (S130), and polling the matrix element (S140).

In more detail, in the forming of the matrix element (S110) the upper electrode and the lower electrode are grouped and the grouped upper and lower electrodes are arrayed in plural, thereby forming the matrix element.

Further, in the measuring of the electrical characteristics of the individual elements (S120), the defective elements are detected by measuring the electrical characteristics for the grouped individual elements in the matrix element.

Further, in the individually applying of the voltage to the defective elements (S130), the grouped upper and lower electrodes are normalized by the method of individually applying the overvoltage only to the detected defective elements to burn the defective elements, thereby removing the defective elements.

Further, in the polling of the matrix element (S140), the defective elements are removed and thus the entire normalized matrix element 110 is polled (S140).

By doing so, the polling method using the polling system according to the preferred embodiment of the present invention may detect the defective elements and apply overvoltage only to the defective elements to normalize the matrix element and then perform the polling on the entire matrix element.

Hereinafter, the polling process using the polling system will be described in more detail with reference to FIG. 4.

Figure 4A:
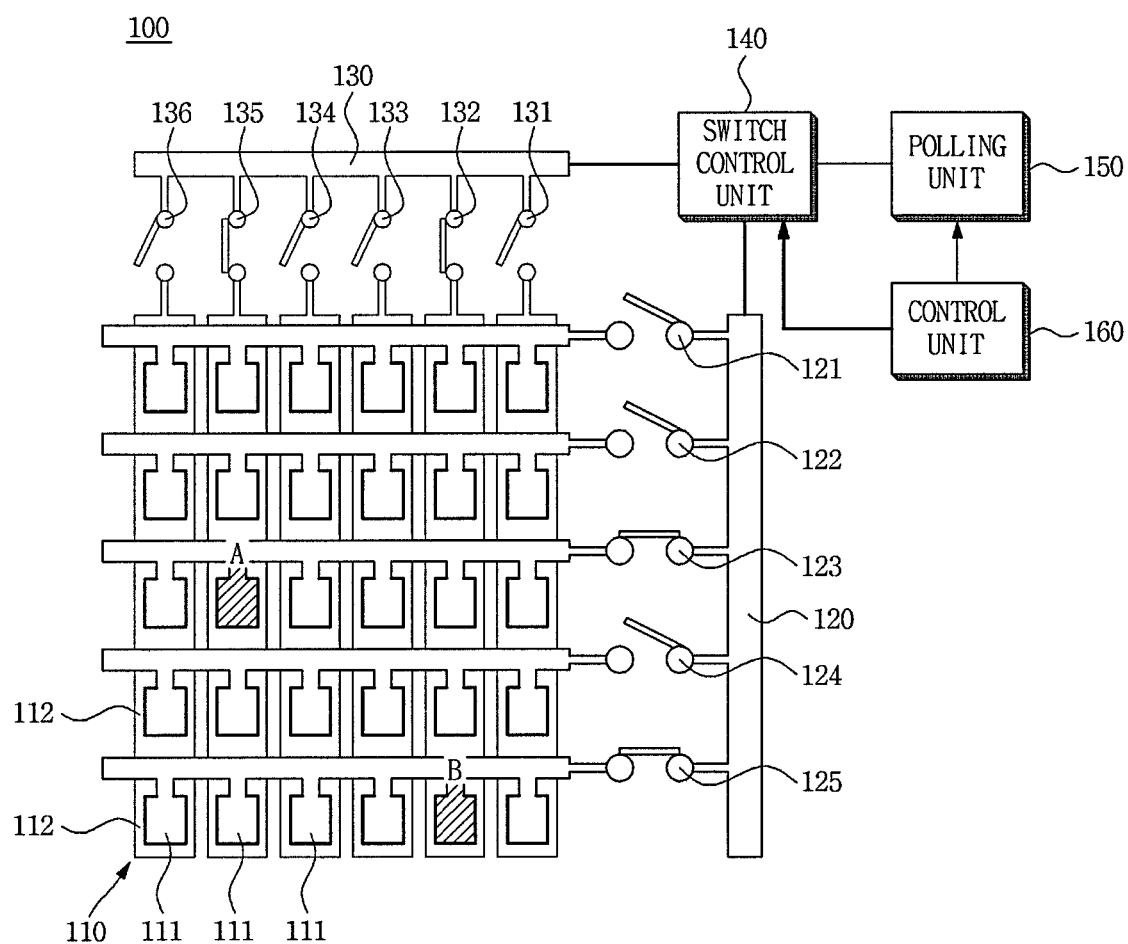
FIG. 4A is a process diagram schematically illustrating a process of removing a defective element and FIG. 4B is a process diagram schematically illustrating a process of polling a matrix element.
Figure 4B:
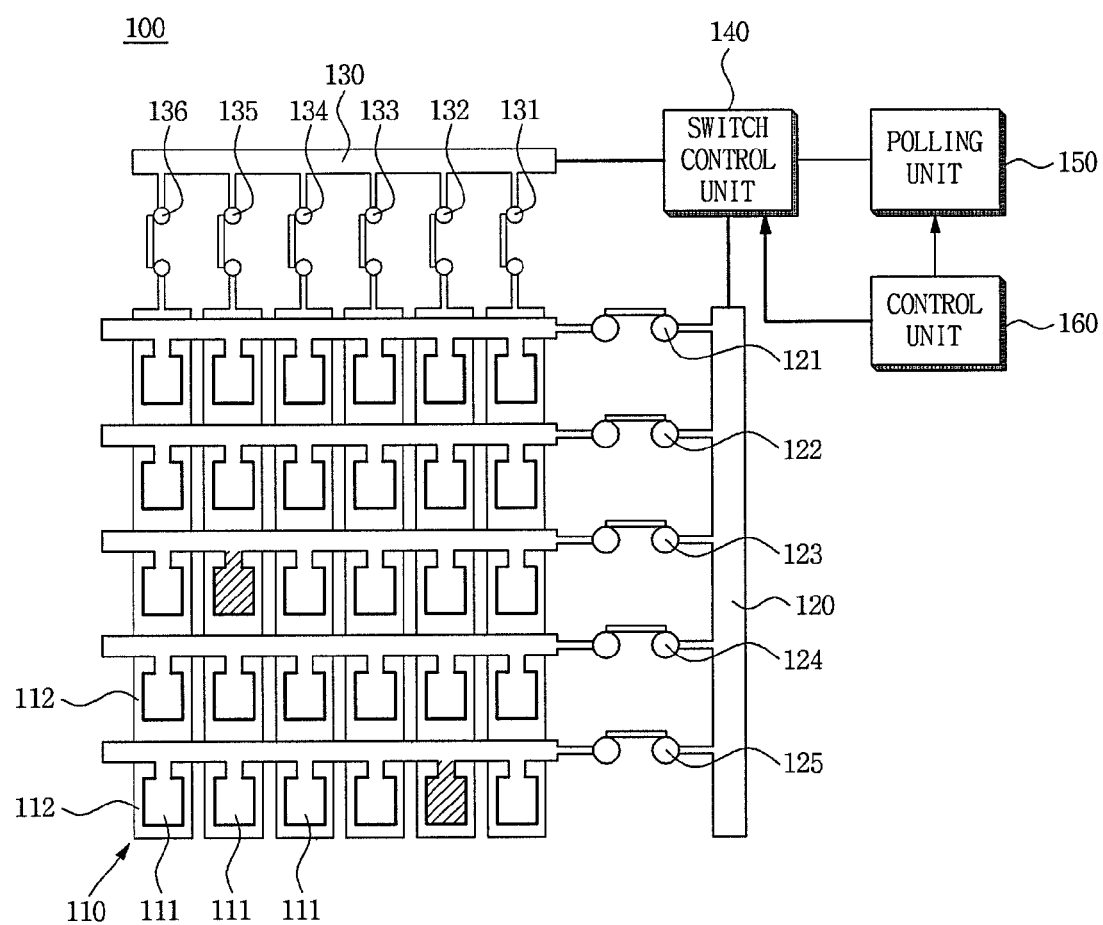

FIG. 4 is a diagram schematically illustrating the process of performing a polling process using the polling system illustrated in FIG. 1, in which FIG. 4A is a process diagram schematically illustrating a process of removing a defective element and FIG. 4B is a process diagram schematically illustrating a process of polling a matrix element.

In more detail, as illustrated in FIG. 4A, the polling system 100 includes the matrix element 110, the upper switch 120, the lower switch 130, the switch control unit 140, the polling unit 150, and the control unit 160. In the matrix element 110, the upper electrodes 111 and the lower electrodes 112 are each arrayed by being grouped, the upper switch 120 is connected to the upper electrodes 111 which are arrayed by being grouped, and the lower switch 130 is connected to the lower electrodes 112 which are arrayed by being grouped.

In addition, the upper switch 120 connected to the upper electrodes 111 includes a first upper switch 121, a second upper switch 122, a third upper switch 123, a fourth upper switch 124, and a fifth upper switch 125.

In addition, the lower switch 130 connected to the lower electrodes 112 includes a first lower switch 131, a second lower switch 132, a third lower switch 133, a fourth lower switch 134, a fifth lower switch 135, and a sixth lower switch 136.

Further, when the individual element marked by A in FIG. 4A is detected as the defective element, the control unit 160 connects the third upper switch 123 of the upper switch 120 to the fifth lower switch 135 of the lower switch 130 to allow the switch control unit 140 to apply overvoltage to the A which is the individual element.

Further, the polling unit 150 applies overvoltage to the individual element A.

Further, when the individual element marked by B in FIG. 4A is detected as the defective element, the control unit 160 connects the fifth upper switch 125 of the upper switch 120 to the second lower switch 132 of the lower switch 130 to allow the switch control unit 140 to apply overvoltage to the B which is the individual element.

Further, the polling unit 150 applies overvoltage to the individual element B.

As described above, the matrix element 110 is normalized by applying overvoltage to the individual elements detected as the defective elements in the matrix element 110 to burn the defective elements.

Next, as illustrated in FIG. 4B, in order to perform the polling on the entire matrix element 110, the first upper switch 121, the second upper switch 122, the third upper switch 123, the fourth upper switch 124, and the fifth upper switch 125 which are the upper switch 120 are turned on and the first lower switch 131, the second lower switch 132, the third switch 133, the fourth lower switch 134, the fifth lower switch 135, and the sixth lower switch 136 which are the lower switch 130 are turned on.

Further, the polling unit 150 performs the polling on the entire matrix element 110.

As set forth above, according to the preferred embodiments of the present invention, it is possible to obtain the polling system capable of detecting the defective elements by measuring the electrical characteristics of each element in the matrix element, removing the defective elements by applying the overvoltage only to the defective elements through the upper switch and the lower switch to burn the defective elements, performing accurate polling by performing the polling on the entire matrix element, and improving the yield of all the elements within the wafer, and the polling method using the same.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A polling system, comprising:
   a matrix element including individual elements including upper electrodes and lower electrodes, the individual elements being arrayed in plural, the upper electrodes of the individual elements being each connected in series to form upper electrode units which are arrayed in plural and the lower electrodes of the individual elements being each connected in series to form lower electrode units which are arrayed in plural;
   an upper switch connected to each of the upper electrode units which are arrayed in plural;
   a lower switch connected to each of the lower electrode units which are arrayed in plural; and
   a polling unit performing polling to apply voltage to the upper electrodes and the lower electrodes, respectively.

2. The polling system as set forth in claim 1, wherein the upper electrode units connected in series and the lower electrode units connected in series are connected to be orthogonal to each other.

3. The polling system as set forth in claim 1, further comprising:
   a switch control unit connected to the upper switch and the lower switch and selectively controlling a turn on and off of the upper switch and the lower switch when the polling unit applies voltage.

4. The polling system as set forth in claim 3, further comprising:

a control unit connected to the polling unit and the switch control unit and controlling the polling and burning.

5. The polling system as set forth in claim 3, wherein the polling unit applies overvoltage only to the individual elements detected as defective elements through the upper switch and the lower switch to burn the individual elements.

6. The polling system as set forth in claim 5, wherein the polling unit applies overvoltage only to the individual elements detected as defective elements through the upper switch and the lower switch to burn the individual elements.

7. A polling method using the polling system as set forth in claim 1, the polling method comprising:
- (A) forming a matrix element by connecting and grouping upper electrodes and lower electrodes and arraying the grouped upper electrodes and lower electrodes in plural;
- (B) measuring electrical characteristics of individual elements by connecting an upper switch to each of the upper electrodes grouped and arrayed in plural in the matrix element and a lower switch to each of the lower electrodes grouped and arrayed in plural therein;
- (C) individually applying overvoltage only to detected defective elements to burn the defective elements; and
- (D) polling the entire matrix element normalized by removing the defective elements.

8. The polling method as set forth in claim 7, wherein in the (C), a plurality of upper switches and a plurality of lower switches each connected to the upper electrodes grouped and arrayed in plural and the lower electrodes grouped and arrayed in plural are selectively operated to apply overvoltage to the defective elements.

9. The polling method as set forth in claim 7, wherein in the (B), the electrical characteristics of the individual elements are resistance, current, a dielectric constant, and a tangent loss.

10. The polling method as set forth in claim 7, wherein in the (D), all of the plurality of upper switches and the plurality of lower switches are turned on and the polling is performed on the entire matrix element.

\* \* \* \* \*